US007215562B2

(12) United States Patent  
Sekine (10) Patent No.: US 7,215,562 B2  
(45) Date of Patent: May 8, 2007

(54) SEMICONDUCTOR STORAGE DEVICE (75) Inventor: Junichi Sekine, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 12 days.

(21) Appl. No.: 11/143,580

(22) Filed: Jun. 3, 2005

(65) Prior Publication Data

US 2005/0270819 A1 Dec. 8, 2005

(30) Foreign Application Priority Data

Jun. 3, 2004 (JP) ............... 2004-166349

(51) Int. Cl.
*G11C 5/06* (2006.01)
(52) U.S. Cl. ................ 365/72; 257/204; 257/205; 257/206
(58) Field of Classification Search .......... 365/72; 257/204–206, 401
See application file for complete search history.

(56) References Cited

U.S. PATENT DOCUMENTS

| 5,834,851 | A  | * | 11/1998 | Ikeda et al. ............. 257/69 |
| 6,700,169 | B2 | * | 3/2004 | Kuroki ............... 257/401 |
| 6,747,320 | B2 | * | 6/2004 | Nakabayashi ........... 257/369 |
| 2001/0019503 | A1 | * | 9/2001 | Ooishi .................. 365/191 |
| 2001/0026496 | A1 | * | 10/2001 | Hidaka ............... 365/230.03 |
| 2003/0173593 | A1 | * | 9/2003 | Miyatake et al. ........ 257/200 |
| 2004/0124440 | A1 | * | 7/2004 | Takemura et al. ........ 257/200 |

FOREIGN PATENT DOCUMENTS

| JP | 11-307741 | 11/1999 |
| JP | 2000-22108 | 1/2000 |

* cited by examiner

*Primary Examiner*—Amir Zarabian  
*Assistant Examiner*—Anthan Tran  
(74) *Attorney, Agent, or Firm*—McDermott Will & Emery LLP

(57) ABSTRACT

A semiconductor storage device in which a pair of wiring lines extending in a first direction are arranged repeatedly with a predetermined pitch, comprising: a group of pair transistors in which a plurality of pair transistors is arranged according to a repetition unit with a predetermined pattern, the pair transistors composed of a MOS transistor of which a gate is connected to one line of the pair of wiring lines and of another MOS transistor of which a gate is connected to the other line of the pair of wiring lines, wherein the repetition unit of the group of pair transistors includes a plurality of the pair transistors such that two MOS transistors are adjacent to each other in the first direction, and at least one pair of pair transistors such that two MOS transistors are not adjacent to each other and diagonally opposite to each other.

7 Claims, 11 Drawing Sheets

SEMICONDUCTOR STORAGE DEVICE

BACKGROUND OF THE INVENTION

1. Field of the Invention

The present invention relates to layout of a semiconductor storage device, and more particularly, to layout of a semiconductor storage device such as DRAM where a plurality of pair transistors is arranged repeatedly and densely in a sense amplifier.

2. Related Art

Figure 8:
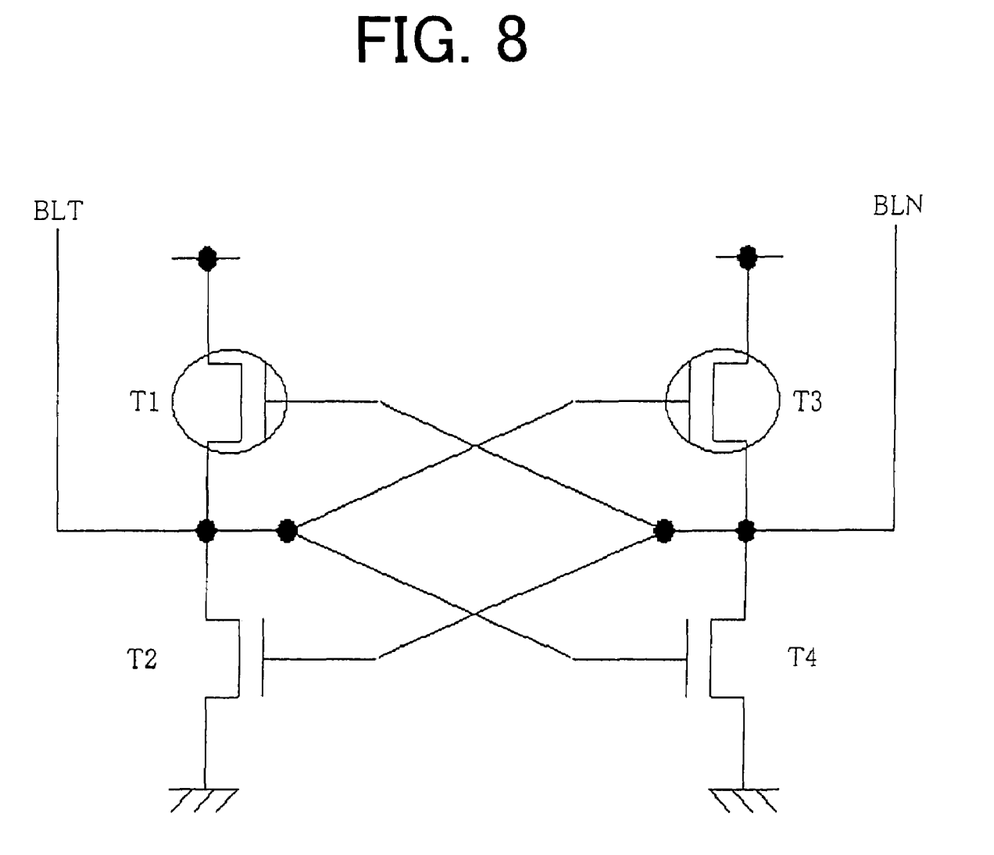
FIG. 8 is a configuration of a sense amplifier circuit in DRAM of the embodiment.

For example, DRAM that is a semiconductor storage device has sense amplifiers each of which detects potentials of a pair of bit lines to amplify a minute potential difference therebetween. The function of the sense amplifier is implemented by a pair of MOS (PMOS or NMOS) transistors (hereinafter, referred to as pair transistors). In other words, as shown in FIG. 8, it is necessary to configure a sense amplifier circuit using PMOS pair transistors T1 and T3 and NMOS pair transistors T2 and T4. In FIG. 8, with respect to a minute potential difference between a pair of bit lines BLT and BLN, it is assumed that one bit line BLT is at a relatively high potential. In this case, the NMOS transistor T4 is turned on by the bit line BLT connected to the gate, thereby pulling down the other bit line BLN connected to the drain to the ground potential. The bit line BLN at the ground potential turns on the PMOS transistor T1, thereby pulling up the bit line BLT to the power supply potential. When the bit lines BLT and BLN are in the inverse potential relationship, the operation inverse to the foregoing is carried out. According to the aforementioned operation, the sense amplifier amplifies the potential difference between a pair of bit lines BLT and BLN.

Figure 9:
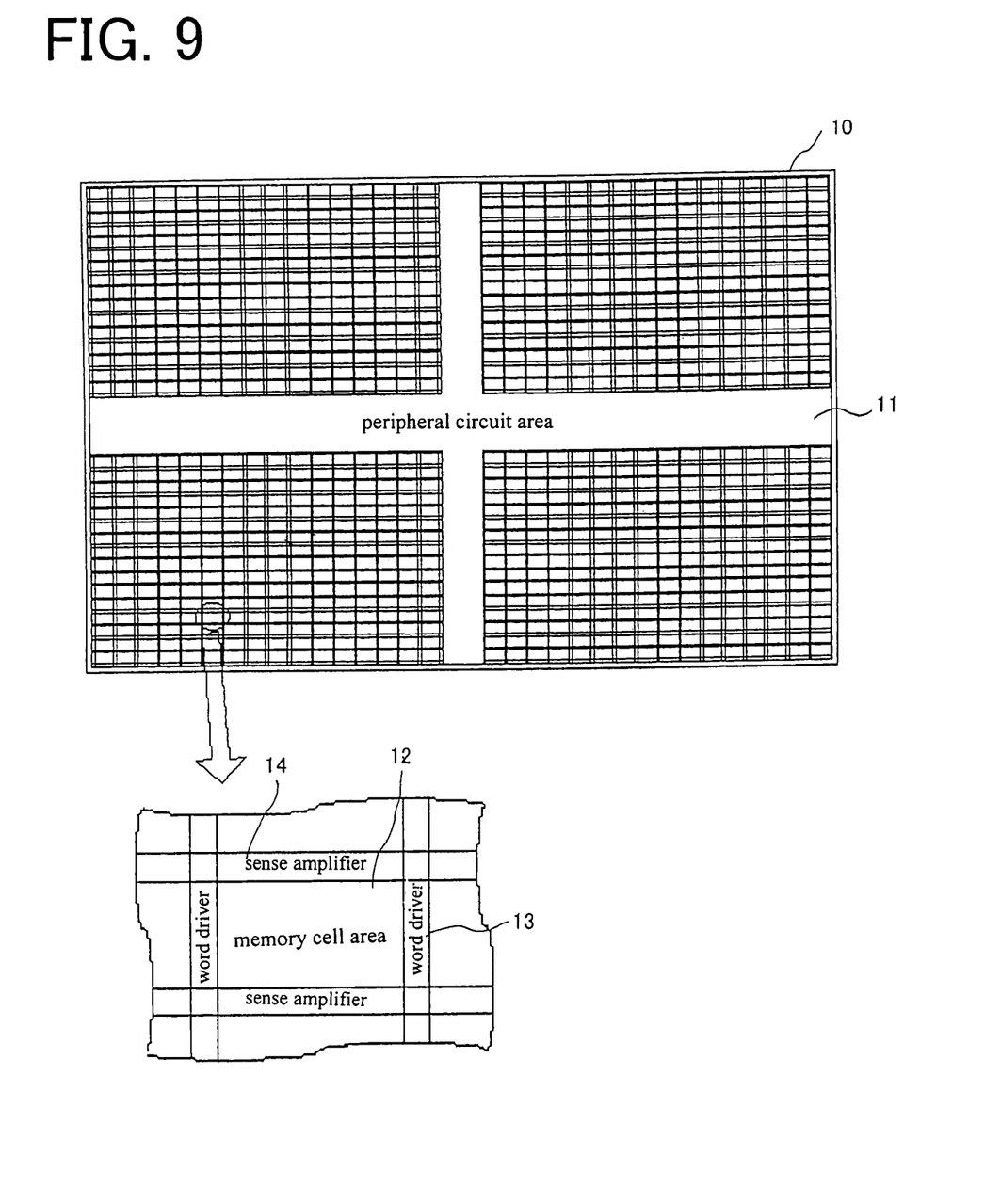
FIG. 9 is a schematic layout diagram of the entire DRAM chip.

It is necessary to arrange a large number of sense amplifiers repeatedly on a chip corresponding to the number of bit lines, and therefore, the sense amplifiers have extremely significant effects on the chip size of DRAM. FIG. 9 shows a schematic layout diagram of the entire chip. The whole of DRAM is comprised of, for example, four banks 10, and a peripheral circuit area 11 is provided between the banks 10. In FIG. 9, the vertical direction is a direction in which the bit lines extend (hereinafter, referred to as a bit line direction), while the horizontal direction is a direction perpendicular to the bit line direction (hereinafter, referred to as a bit line perpendicular direction). Each of the banks 10 is divided into a plurality of memory cell areas 12 including a predetermined number of word lines and a predetermined number of bit lines.

On the lower side of FIG. 9 is shown an enlarged view of the memory cell area 12 and its surroundings. Around the memory cell area 12 are disposed a word driver area 13 that drives the word lines, and a sense amplifier area 14 comprised of the above-mentioned sense amplifiers. The sense amplifier area 14 thus needs to be provided as a division for each memory area 12, and therefore, has a considerable effect on the chip size. Accordingly, it is required to design the sense amplifier particularly in a small size among circuits constituting DRAM.

Further, considering the function of the sense amplifier as described above, since the minute potential difference to amplify corresponds to extremely small electric charge to be stored in a memory cell, in order to perform appropriate amplification, a pair of bit lines also require a design with balanced loads such as resistance and capacitance. When the resistance and capacitance of a pair of bit lines is not suitable, serious failures may occur such as inversion of data to store, and therefore, such a design is important that a pair of bit lines keep excellent balance therebetween.

As described above, in the design of a sense amplifier, the issue is a design in consideration of both improvements in characteristics and reduction in area. Constitution examples of the sense amplifier based on such an issue have conventionally been proposed. For example, one of the conventional constitution examples (see FIG. 6 in JP H11-307741) or another one of the conventional constitution examples (see FIG. 8 in JP 2000-22108) discloses a constitution such that two pair transistors in line, i.e. four transistors are arranged in the bit line direction in an area of a pair of bit lines, and that such a layout is repeated as a repetition unit according to a pitch of the bit lines. These constitutions of a sense amplifier are obtained by devising a layout in consideration of both effects of the improvements in characteristics and reduction in area.

However, according to reduction in memory cell size with progress of manufacturing techniques, the bit line pitch dependent on the memory cell size has been narrowed. In forming a transistor in a group of pair transistors as described above, considering physically providing the gate, drain/source diffusion layer, contact and the like, arrangements corresponding to narrowed bit line pitches have become difficult gradually.

Figure 10:
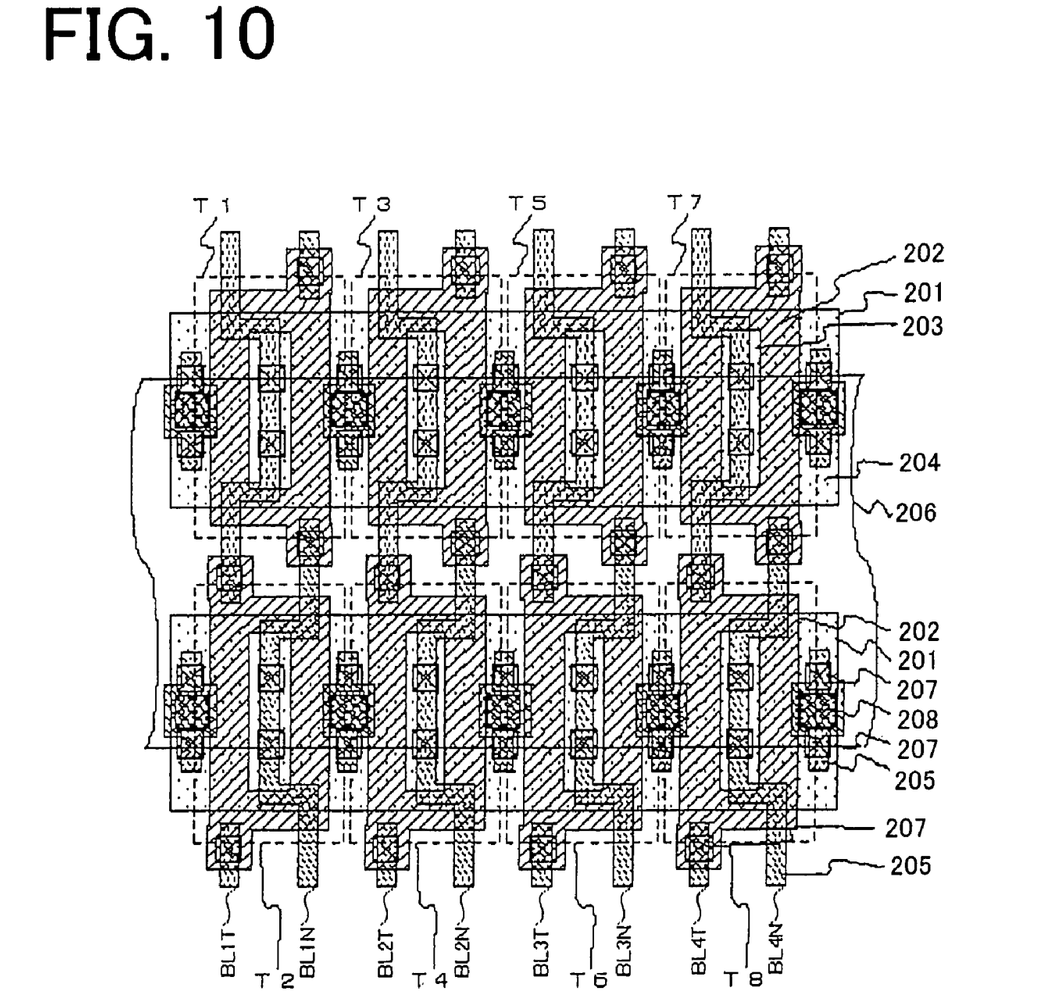
FIG. 10 is a view showing a layout of a group of pair transistors according to the conventional arrangement.

For example, FIG. 10 is a view showing a layout of a group of pair transistors according to the conventional arrangement. In FIG. 10, eight transistors T1 to T8 constitute pair transistors T1 and T2, pair transistors T3 and T4, pair transistors T5 and T6, and pair transistors T7 and T8. A pair of bit lines (BL1T, BL1N and the like) is arranged for each pair of transistors. In the bit line perpendicular direction (horizontal direction as viewed in the figure) of the four pair transistors are formed a diffusion layer 201, each gate 202 in the shape of a ring, drain (diffusion layer) 203, source (diffusion layer) 204, wiring 205, upper wiring 206, contact 207 and through hole 208. With consideration given to the bit line pitch and required function elements, the layout provides a high dense arrangement under the most extreme conditions. If structural elements are configured with a bit line pitch narrower than the limit in FIG. 10, such a pitch becomes a factor to cause a short-circuit of different contacts in manufacturing. Further, decreasing the width and size of a structural element of a layout becomes factors of a break in wiring or blockage of the contact. Accordingly, it is difficult to make pair transistors finer in the configuration as shown in FIG. 10.

Figure 11:
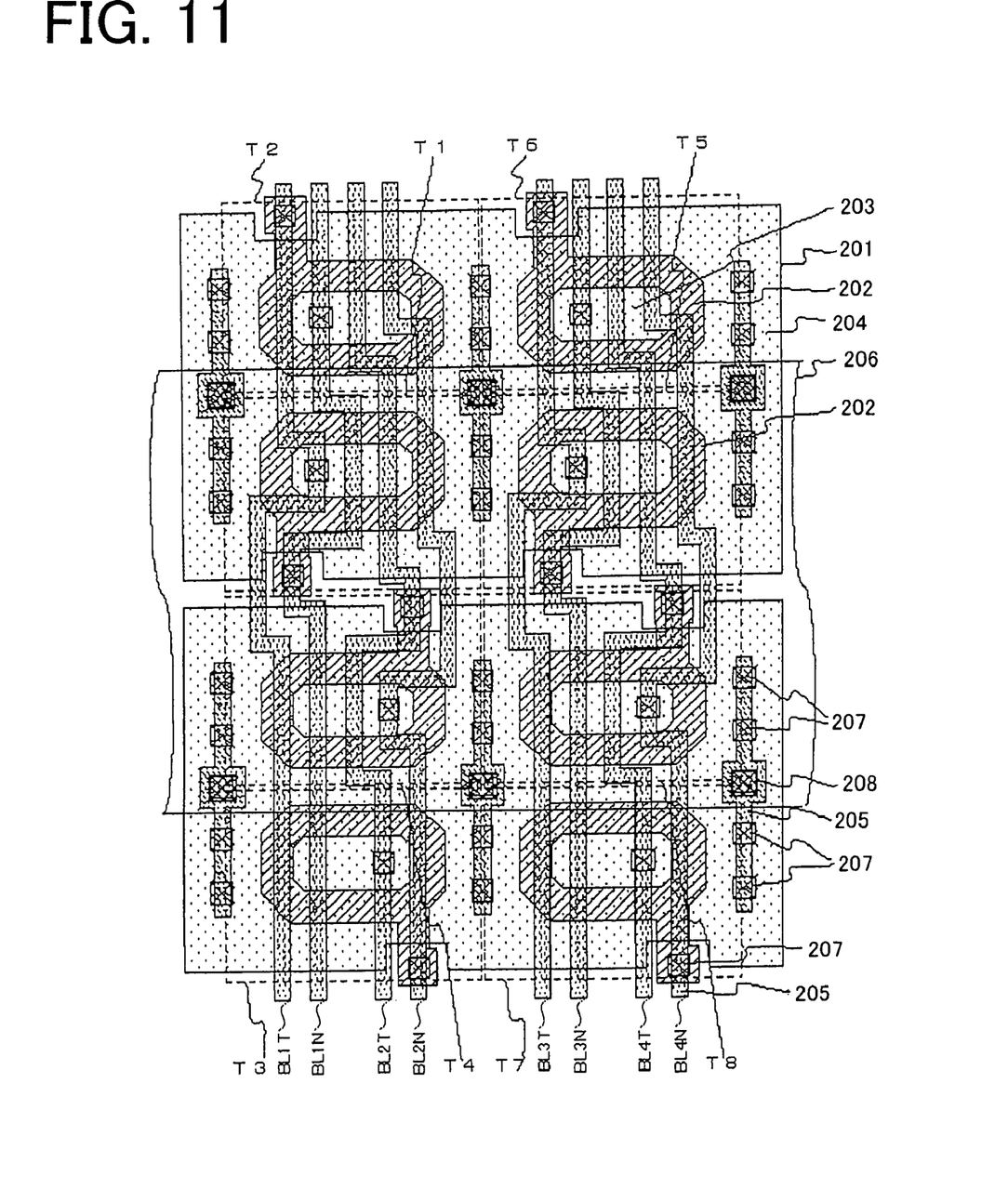
FIG. 11 is a view showing another layout of a group of pair transistors according to the conventional arrangement.

Meanwhile, FIG. 11 is a view showing a layout of a group of pair transistors provided with measures as described above. In FIG. 11, the same circuit as in FIG. 10 is comprised of a different layout, while combinations of four pairs are the same as in FIG. 10, i.e. pair transistors T1 and T2, pair transistors T3 and T4, pair transistors T5 and T6, and pair transistors T7 and T8 exist. In FIG. 11, with respect to four pairs of pair transistors for a pair of bit lines, the pair transistors are arranged in two stages in the bit line perpendicular direction, while being arranged also in two stages in the bit line direction. In this respect, the layout in FIG. 11 is different from that in FIG. 10. Such a constitution provides the pair transistors with the same combinations as in FIG. 10, while shifting the arrangement, eases physical limits such as wiring in the horizontal direction, intervals and the like in consideration of improvements in characteristics, and thus is an advantageous constitution in reduction in bit line pitch.

However, even when the constitution as shown in FIG. 11 is adopted, since the pair transistors have a two-stage structure in the bit line direction, it is inevitable that the size in the bit line direction is extremely increased as compared to the constitution of FIG. 10. In other words, the constitution of FIG. 11 still has the problem of having a significant effect on the chip size.

SUMMARY OF THE INVENTION

It is an object of the present invention to provide a semiconductor storage device provided with a group of pair transistors in an arrangement advantageous for improvements in characteristics within physical limits of microfabrication in the semiconductor storage device without resulting in increases in chip area.

A semiconductor storage device according to an aspect of the present invention in which a pair of wiring lines extending in a first direction are arranged repeatedly with a predetermined pitch, comprising: a group of pair transistors in which a plurality of pair transistors is arranged according to a repetition unit with a predetermined pattern, said pair transistors composed of a MOS transistor of which a gate is connected to one line of said pair of wiring lines and of another MOS transistor of which a gate is connected to the other line of said pair of wiring lines, wherein said repetition unit of said group of pair transistors includes a plurality of said pair transistors such that two MOS transistors are adjacent to each other in said first direction, and at least one of said pair transistors such that two MOS transistors are not adjacent to each other and diagonally opposite to each other.

In the semiconductor storage device according to the aspect of the present invention, said repetition unit of said group of pair transistors is formed of a rectangle area including six MOS transistors that are arranged in three stages in said first direction while being arranged in two stages in a direction perpendicular to said first direction, and comprises first pair transistors composed of a MOS transistor positioned in a predetermined corner of said rectangle area and another MOS transistor adjacent to said MOS transistor in said first direction, second pair transistors composed of a MOS transistor positioned in a corner diagonally opposite to said predetermined corner of said rectangle area and another MOS transistor adjacent to said MOS transistor in said first direction, and third pair transistors composed of two MOS transistors which are not included in said first pair transistors nor said second pair transistors, not adjacent to each other, and arranged in a diagonal direction.

In the semiconductor storage device according to the aspect of the present invention, said repetition unit of said group of pair transistors is formed of a rectangle area including eight MOS transistors that are arranged in three stages in said first direction while being arranged in three stages in a direction perpendicular to said first direction except a central region, and comprises first pair transistors composed of a MOS transistor positioned in a predetermined corner of said rectangle area and another MOS transistor adjacent to said MOS transistor in said first direction, second pair transistors composed of a MOS transistor positioned in a corner diagonally opposite to said predetermined corner of said rectangle area and another MOS transistor adjacent to said MOS transistor in said first direction, third pair transistors composed of two MOS transistors which are not included in said first pair transistors nor said second pair transistors, not adjacent to each other, and arranged in a diagonal direction, and fourth pair transistors composed of two MOS transistors which are not included in said first pair transistors, said second pair transistors nor said third pair transistors, not adjacent to each other, and arranged in a diagonally direction.

In the semiconductor storage device according to the aspect of the present invention, a non-active MOS transistor is arranged in said central region.

In the semiconductor storage device according to the aspect of the present invention, said group of pair transistors is for use in a sense amplifier circuit that detects potentials of a pair of bit lines connected to a memory cell array and that amplifies a minute potential difference therebetween, and said pair of bit lines that are said pair of wiring lines extend in a bit line direction that is said first direction.

In the semiconductor storage device according to the aspect of the present invention, said gate of said MOS transistor is formed in the shape of a ring.

In the semiconductor storage device according to the aspect of the present invention, said gate of said MOS transistor is formed in the shape of a U.

According to the present invention, a group of pair transistors used in a semiconductor storage device is capable of achieving a layout with increases in chip area restricted while maintaining excellent characteristics. In particular, in the case of configuring a sense amplifier circuit of DRAM, even when the bit line pitch becomes narrow, it is possible to achieve both improvements in characteristics and reduction in area, and the utility is thus high. Further, various arrangements are applicable as a repetition unit in a group of pair transistors, for example, a non-active transistor can be arranged in the center, and it is thus possible to configure a group of pair transistors capable of flexibly supporting bit line pitches.

DETAILED DESCRIPTION OF THE INVENTION

A preferred embodiment of the present invention will specifically be described below with reference to accompanying drawings. This embodiment describes the case of applying the invention to DRAM as a semiconductor storage device.

Figure 1:
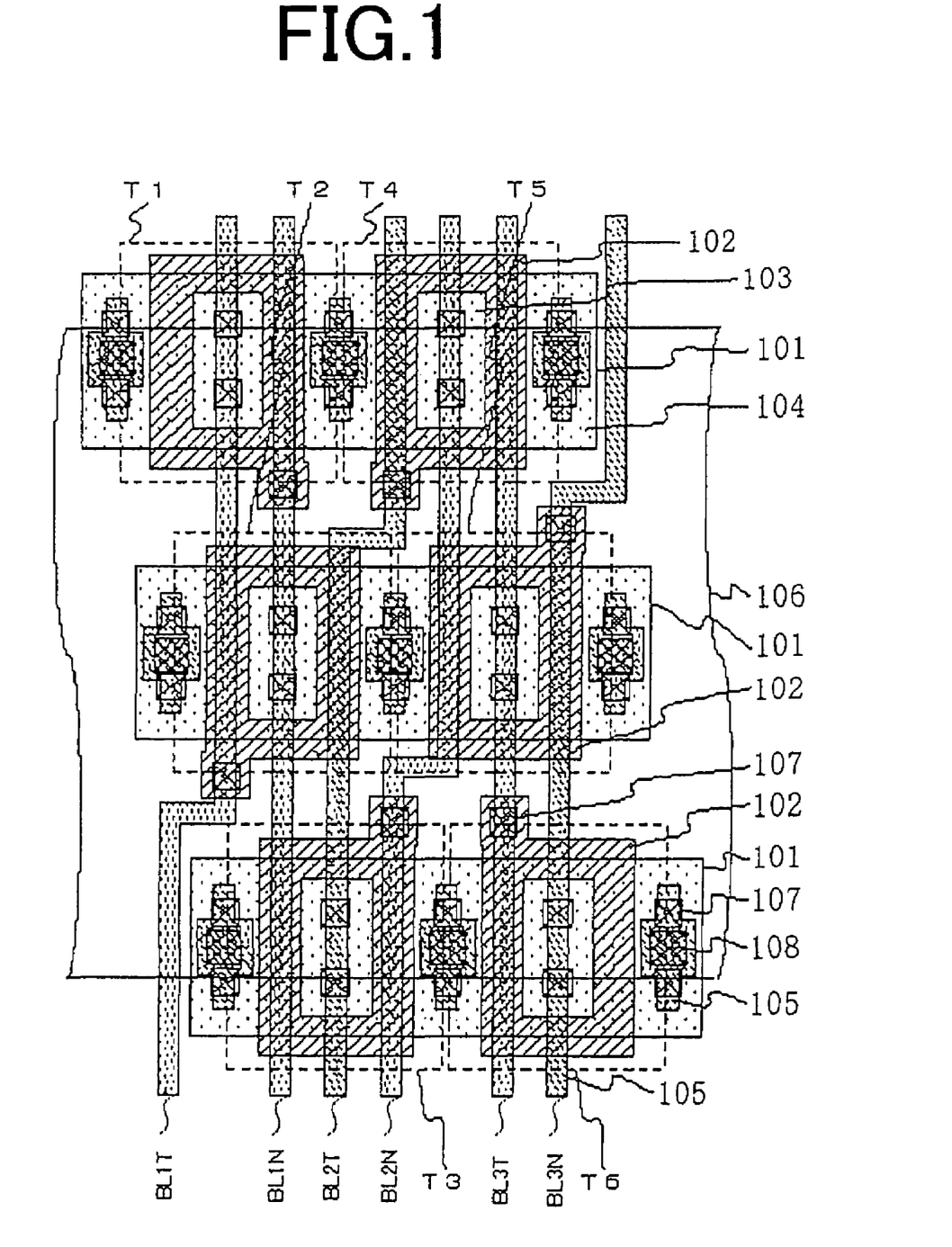
FIG. 1 is a layout diagram of a group of pair transistors arranged corresponding to three pairs of bit lines in respective sense amplifiers in DRAM of the embodiment.
Figure 2:
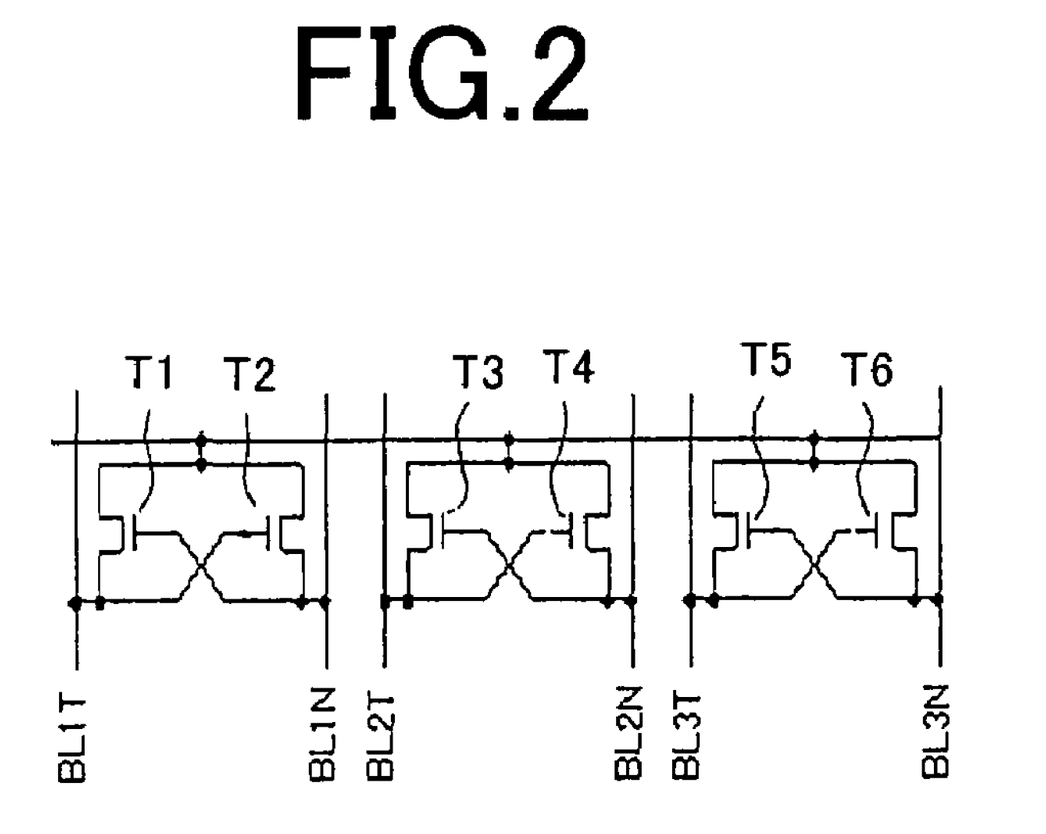
FIG. 2 is a circuit diagram corresponding to the layout diagram of FIG. 1.

FIG. 1 is a layout diagram of a group of pair transistors arranged corresponding to three pairs of bit lines (six bit lines) in respective sense amplifiers in DRAM of this embodiment. FIG. 2 is a circuit diagram corresponding to the layout diagram of FIG. 1. In addition, while FIGS. 1 and 2 show only NMOS transistors, PMOS transistors have the same configuration.

In FIG. 1, each of six NMOS transistors T1 to T6 (hereinafter, simply referred to as transistors T1 to T6) is comprised of a drain 103 and a source 104 both formed on a diffusion layer 101 and a ring-shaped gate 102. Wiring 105 connected to the gate 102 via a contact 107 is formed, and the wiring 105 and upper wiring 106 is connected via a through hole 108. In addition, a width and interval of each wiring or a width, interval and the like of the contact 107 are determined depending on the manufacturing process and design items to some extent, while the bit line pitch is determined depending on the memory cell size.

Herein, in the transistors T1 to T6, transistors T1 and T2 constitute first pair transistors, transistors T5 and T6 constitute second pair transistors, and transistors T3 and T4 constitute third pair transistors. A pair of bit lines BL1T and BL1N support the first pair transistors, a pair of bit lines BL2T and BL2N support the third pair transistors, and a pair of bit lines BL3T and BL3N support the second pair transistors.

As can be seen from FIG. 1, the six transistors T1 to T6 are arranged in three stages in the bit line direction, while being arranged in two stages in the bit line perpendicular direction, and such a layout as a repetition unit is repeated to constitute the entire sense amplifiers. In each repetition unit, two transistors constituting the first or second pair transistors are adjacent to each other in the bit line direction, while transistors T3 and T4 constituting the third pair transistors are not adjacent to each other in the bit line direction, and are diagonally opposite to each other across the first and second pair transistors.

As compared to the conventional constitutions of FIGS. 10 and 11, the arrangement of the third pair transistors is a feature of the constitution of this embodiment. As described previously, when compared with the constitution of FIG. 10 having difficulties obtaining an element arrangement to support the trend toward reduction in bit line pitch, and the constitution of FIG. 11 that increases the chip size with increases in size in the bit line direction, the constitution of this embodiment enables achievement of a rational element arrangement with less wasted space. In other words, in the constitutions as shown in FIGS. 10 and 11, it is a basic concept that two transistors constituting pair transistors are always adjacent to each other. In contrast thereto, in the case of this embodiment, with such a concept broken, adopted is the constitution including pair transistors composed of two transistors that are not adjacent to each other. By this means, it is possible to prevent increases in size in the bit line direction of a group of pair transistors, for example, which are seen in the constitution of FIG. 11, while supporting the trend toward reduction in bit line pitch. By adopting such a constitution, the chip area can be used effectively in both the bit line direction and bit line perpendicular direction, and as a result, it is possible to achieve reduction in chip size.

As described above, in the constitution of this embodiment, two transistors T1 and T2 or T5 and T6 respectively constituting the first or second pair transistors are adjacent to each other, while two transistors T3 and T4 constituting the third pair transistors are diagonally opposite to each other across the first and second pair transistors. Therefore, due to such a large difference in configuration, in a strict sense, the first and second pair transistors are different in characteristics from the third pair transistors. However, the differences in characteristics are only caused by a difference in wiring length of the order of a few micrometers, within a minute range, and do not provide any problems with functions of the entire sense amplifiers.

Referring to FIG. 1 again, positions of transistors arranged in the bit line direction are slightly shifted in the bit line perpendicular direction among transistors of the same pair or different pairs. It is a device in arrangement to make bit lines straight as much as possible without bending as little as possible. For example, referring to FIGS. 10 and 11 illustrating the conventional layouts, positions of transistors opposite to each other in the bit line direction are aligned in the pair transistors, but the wiring 105 of bit line is bent for the need for connecting the drain 103 of one transistor and the gate 102 of the other transistor. Meanwhile, in the constitution as shown in FIG. 1, if opposite transistors are aligned in the bit line direction as in FIG. 11, an arrangement is required such that the wiring 105 is bent. However, such an arrangement needs a large distance between transistors arranged in the bit line direction to secure areas of bent portions, and results in increases in chip size. Accordingly, as shown in FIG. 1, by shifting positions of transistors arranged in the bit line direction slightly in the bit line perpendicular direction, it is made possible configuring the wiring 105 using straight lines as much as possible, and as a result, increases in chip size can be prevented.

Specific advantages in chip size will be described below with respect to DRAM using the constitution of this embodiment. As described previously, parameters belonging to design items of a MOS transistor are not determined uniquely, and as an example, following design conditions are assumed. That is, in FIG. 1, when MOS device is designed with a gate having a width of 0.3 μm and a length of 2.0 μm, the width of a diffusion layer for one-stage MOS device is 1.3 μm, and further, assuming a design where an interval between diffusion layers is 0.82 μm and an upper or lower protrusion from the diffusion layer is 0.35 μm, the size in the bit line direction is total 6.24 μm. Meanwhile, in the conventional constitution in FIG. 11, if it is assumed to design MOS device with substantially same dimensions under the same design conditions, the width of a diffusion layer for two-stage MOS device is 3.4 μm, an interval between diffusion layers is 0.26 μm, an upper or lower protrusion from the diffusion layer is 0.4 μm, and the size in the bit line direction is total 7.86 μm. Accordingly, by adopting the constitution to which the present invention is applied, it is possible to achieve an about 20% reduction in size as compared to the conventional constitution. However, such a rate is affected by design rules and determinations in design and varies.

Figure 3:
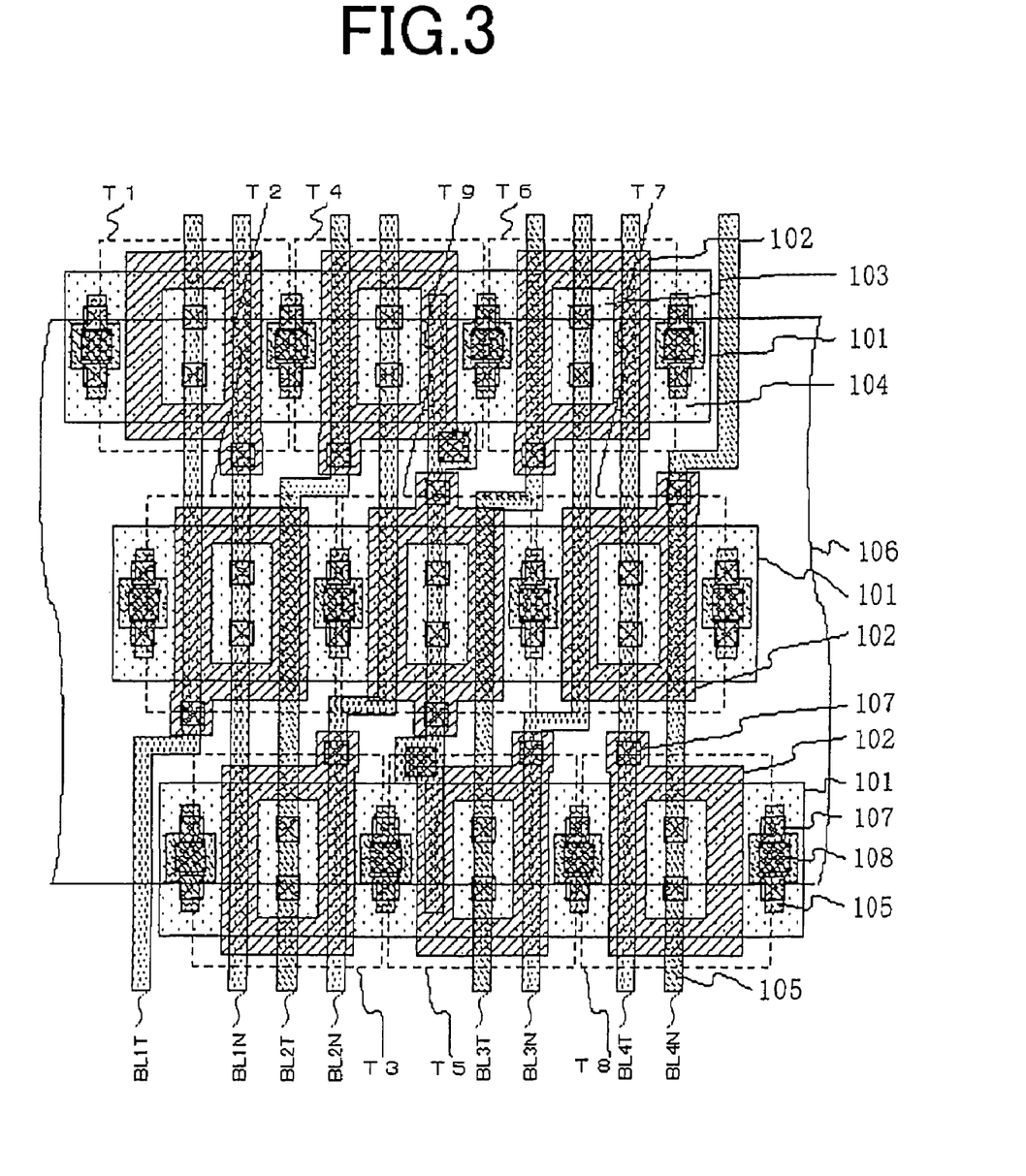
FIG. 3 is a layout diagram of a group of pair transistors arranged corresponding to four pairs of bit lines in respective sense amplifiers in DRAM of the embodiment.
Figure 4:
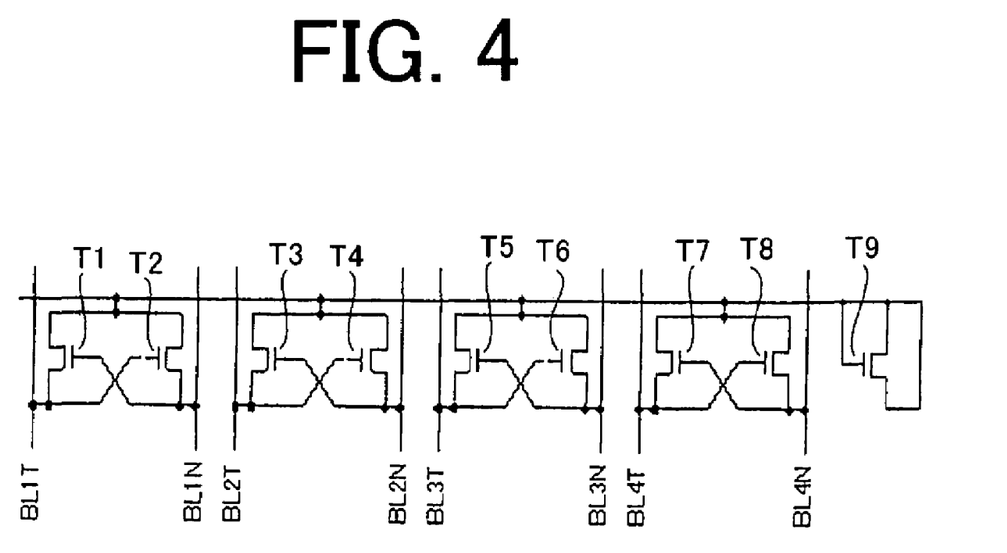
FIG. 4 is a circuit diagram corresponding to the layout diagram of FIG. 3.

FIG. 3 is a layout diagram of a group of pair transistors arranged corresponding to four pairs of bit lines in respective sense amplifiers in DRAM of this embodiment. FIG. 4 is a circuit diagram corresponding to the layout diagram of FIG. 3. In addition, while FIGS. 3 and 4 show only NMOS transistors, PMOS transistors have the same configuration.

Shown in FIG. 3 is a layout including nine transistors T1 to T9. Basic structures are the same as in FIG. 1 of the diffusion layer 101, ring-shaped gate 102, drain 103, source 104, wiring 105, upper wiring 106, contact 107 and through hole 108.

Herein, in transistors T1 to T8, transistors T1 and T2 constitute first pair transistors, transistors T7 and T8 constitute second pair transistors, transistors T3 and T4 constitute third pair transistors, and transistors T5 and T6 constitute fourth pair transistors. A pair of bit lines BL1T and BL1N support the first pair transistors, a pair of bit lines BL2T and BL2N support the third pair transistors, a pair of bit lines BL3T and BL3N support the fourth pair transistors, and a pair of bit lines BL4T and BL4N support the second pair transistors.

The transistor T9 arranged in the center is a non-active transistor, and does not constitute pair transistors with another transistor. As shown in FIG. 4, the gate, drain and source of the transistor T9 are short-circuited.

As can be seen from FIG. 3, the nine transistors T1 to T9 are arranged in three stages in the bit line direction, while being arranged in three stages in the bit line perpendicular direction, and such a layout as a repetition unit is repeated to constitute the entire sense amplifiers. In each repetition unit, two transistors constituting the first or second pair transistors are adjacent to each other in the bit line direction, while two transistors constituting the third or fourth pair transistors are not adjacent to each other in the bit line direction, and are diagonally opposite to each other across the other transistors. Thus, with respect to pair transistors forming the characteristic arrangement of this embodiment, the layout in FIG. 3 has two pairs existing in the repetition unit, and in this respect, is different from the layout in FIG. 1 where only one pair exists in the repetition unit.

In the case where the bit line pitch is the narrowest which is determined depending on the memory cell size, it is preferable adopting the arrangement as shown in FIG. 1, but when the bit line pitch is provided with a relatively extra margin, the arrangement in FIG. 3 is sufficiently effective. While all the transistors are active in the case of FIG. 1, the repetition unit includes a non-active transistor in the case of FIG. 3. By thus daring to dispose a non-active transistor in the repetition unit, the size in the bit line perpendicular direction can be adjusted as appropriate for the bit line pitch.

For example, in the case of making the size of pair transistors constant in the bit line perpendicular direction, in the constitution in FIG. 1 it is possible to dispose three pairs of bit lines (six bit lines) for transistors of two stages in the bit line perpendicular direction. Meanwhile, in the constitution in FIG. 3 it is possible to dispose four pairs of bit lines (eight bit lines) for transistors of three stages in the bit line perpendicular direction. In other words, in terms of transistors of three stages in the bit line perpendicular direction, the constitution in FIG. 1 corresponds to nine bit lines, while the constitution in FIG. 3 corresponds to eight bit lines, and it is understood that the constitution in FIG. 3 eases the bit line pitch to some extent. Thus, in this embodiment, it is possible to flexibly adopt a constitution suitable for the bit line pitch.

In addition, the repetition unit in this embodiment is not limited to the constitution as shown in FIG. 1 or 3, and for example, it is possible to dispose a repetition unit in a combination of the constitutions of FIGS. 1 and 3. Further, in a group of pair transistors in this embodiment, also when the arrangement as shown in FIG. 1 or 3 is configured to be symmetric with respect to a line in the bit line direction, the same functions can be achieved.

The constitution of FIG. 3 allows a plurality of modifications. The modifications of the constitution of FIG. 3 will be described below with reference to FIGS. 5 to 7.

Figure 5:
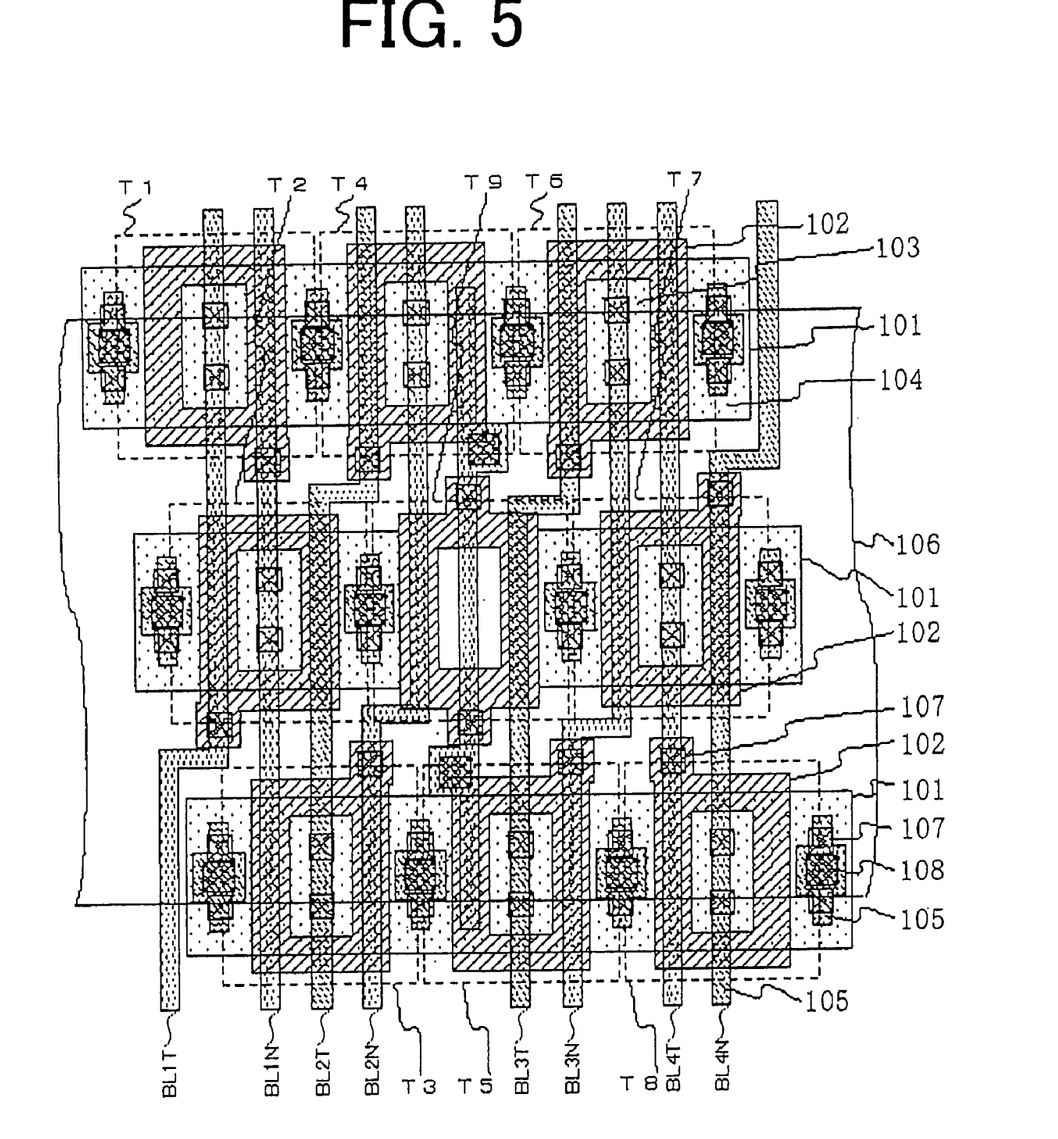
FIG. 5 is a diagram illustrating the first modification of the constitution of FIG. 3.

FIG. 5 is a diagram illustrating the first modification of the constitution of FIG. 3. In FIG. 5, basic structural elements are the same as those in FIG. 3 and descriptions thereof are omitted. The constitution of FIG. 5 is not provided with the non-active transistor T9 which exists in FIG. 3, and is provided with a different structure in this portion. In other words, the ring-shaped gate 102 is provided in the central region surrounded by eight transistors T1 to T8, while the diffusion layer 101 and contact are eliminated inside the gate 102.

Figure 6:
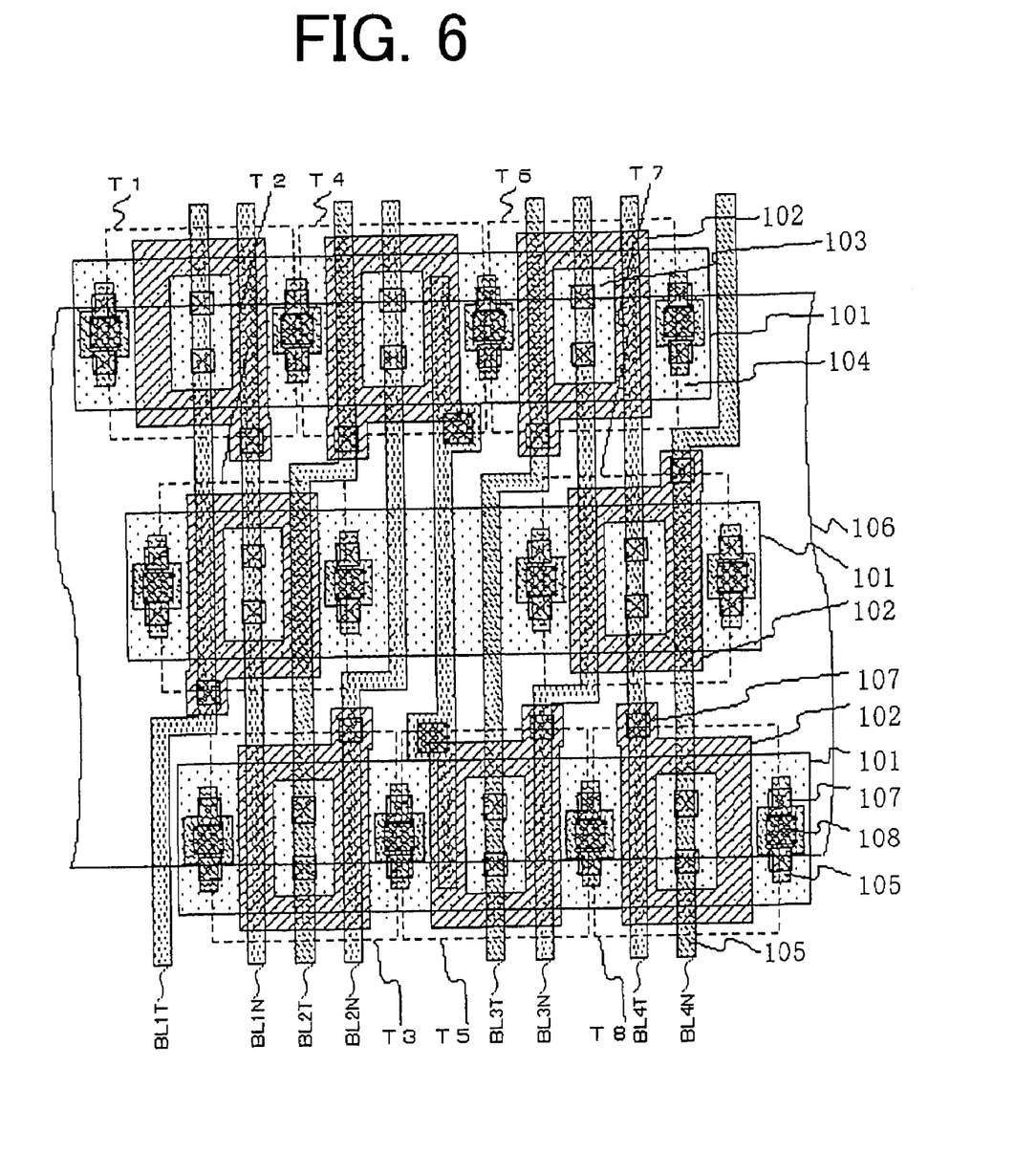
FIG. 6 is a diagram illustrating the second modification of the constitution of FIG. 3.

FIG. 6 is a diagram illustrating the second modification of the constitution of FIG. 3. Also in FIG. 6, basic structural elements are the same as those in FIG. 3 and descriptions thereof are omitted. The constitution of FIG. 6 is not provided with the non-active transistor T9 which exists in FIG. 3, and is provided with a different structure in this portion. In other words, the diffusion layer 101 is formed in the central region surrounded by eight transistors T1 to T8, while the ring-shaped gate 102 and the contact inside the gate are eliminated.

Figure 7:
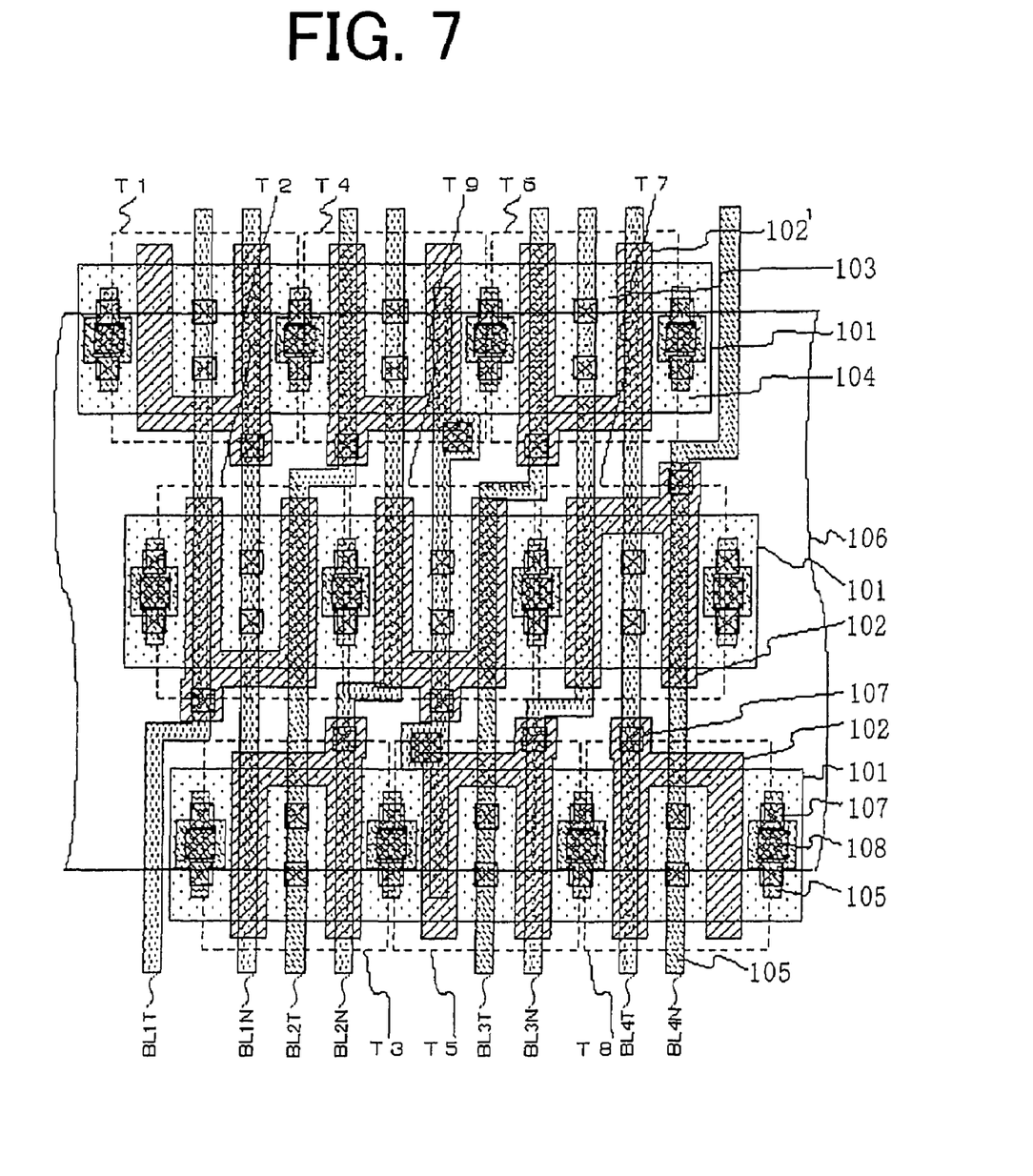
FIG. 7 is a diagram illustrating the third modification of the constitution of FIG. 3.

FIG. 7 is a diagram illustrating the third modification of the constitution of FIG. 3. Also in FIG. 7, basic structural elements are the same as those in FIG. 3 and descriptions thereof are omitted. The constitution of FIG. 7 is not provided with the non-active transistor T9 which exists in FIG. 3, and is provided with a different structure in this portion. In other words, in the central region surrounded by eight transistors T1 to T8 are provided the diffusion layer 101, contact and a U-shaped gate 102' as a substitute for the ring-shaped gate 102. The U-shaped gate 102' is used to form the channel of a transistor as in the ring-shaped gate 102, and has the same basic operation as that of the gate 102.

The constitutions of this embodiment to which the present invention is applied are described in the foregoing, but the present invention is not limited to the aforementioned embodiment, and is capable of being carried into practice with various modifications and changes that can be easily conceived by a person skilled in the art.

The invention claimed is:

1. A semiconductor storage device in which a plurality of pairs of wiring lines extending in a first direction are arranged repeatedly with a predetermined pitch, comprising:
   a group of pair transistors in which a plurality of pair transistors having a same amplifying function is arranged according to a predetermined structural pattern, each of said pair transistors is connected to a respective pair of said plurality of pairs of wiring lines and is composed of a MOS transistor of which a gate is connected to one line of said respective pair of wiring lines and of another MOS transistor of which a gate is connected to the other line of said respective pair of wiring lines,
   wherein said predetermined structural pattern forms a repetition unit that is repeated for the plurality of pairs of wiring lines, one of said pair transistors of the repetition unit having two MOS transistors that are adjacent to each other in said first direction, and at least one of said pair transistors of the repetition unit having two MOS transistors that are not adjacent to each other and are diagonally opposite to each other.

2. A semiconductor storage device according to claim 1, wherein said repetition unit is formed of a rectangle area including six MOS transistors that are arranged in three stages in said first direction while being arranged in two stages in a direction perpendicular to said first direction, and comprises
   first pair transistors composed of a MOS transistor positioned in a predetermined corner of said rectangle area and another MOS transistor adjacent to said MOS transistor in said first direction, second pair transistors composed of a MOS transistor positioned in a corner diagonally opposite to said predetermined corner of said rectangle area and another MOS transistor adjacent to said MOS transistor in said first direction, and third pair transistors composed of two MOS transistors which are not included in said first pair transistors nor said second pair transistors, not adjacent to each other, and arranged in a diagonal direction.

3. A semiconductor storage device according to claim 1, wherein said repetition unit is formed of a rectangle area including eight MOS transistors that are arranged in three stages in said first direction while being arranged in three stages in a direction perpendicular to said first direction except a central region, and comprises first pair transistors composed of a MOS transistor positioned in a predetermined corner of said rectangle area and another MOS transistor adjacent to said MOS transistor in said first direction, second pair transistors composed of a MOS transistor positioned in a corner diagonally opposite to said predetermined corner of said rectangle area and another MOS transistor adjacent to said MOS transistor in said first direction, third pair transistors composed of two MOS transistors which are not included in said first pair transistors nor said second pair transistors, not adjacent to each other, and arranged in a diagonal direction, and fourth pair transistors composed of two MOS transistors which are not included in said first pair transistors, said second pair transistors nor said third pair transistors, not adjacent to each other, and arranged in a diagonally direction.

4. A semiconductor storage device according to claim 3, wherein a non-active MOS transistor is arranged in said central region.

5. A semiconductor storage device according to any one of claims 1 to 4, wherein said pairs of wiring lines are pairs of bit lines and said group of pair transistors is for use in a sense amplifier circuit that detects potentials of pairs of bit lines connected to a memory cell array and that amplifies minute potential differences therebetween, and said pairs of bit lines extend in a bit line direction that is said first direction.

6. A semiconductor storage device according to claim 1, wherein said gate of said MOS transistor is formed in the shape of a ring.

7. A semiconductor storage device according to claim 1, wherein said gate of said MOS transistor is formed in the shape of a U.

* * * * *